(12) United States Patent
Ahn et al.

(10) Patent No.: US 6,833,285 B1
(45) Date of Patent: Dec. 21, 2004

(54) METHOD OF MAKING A CHIP PACKAGING DEVICE HAVING AN INTERPOSER

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/660,324

(22) Filed: Sep. 12, 2000

Related U.S. Application Data

(62) Division of application No. 09/241,061, filed on Feb. 1, 1999, now Pat. No. 6,274,937.

(51) Int. Cl.[7] .......................... H01L 21/44; H01L 21/48; H01L 21/50
(52) U.S. Cl. ................... 438/107; 438/108; 257/E25.03
(58) Field of Search ............................... 438/106, 107, 438/108, 110, 113, 118, 119, 384, 381, 387, FOR 381; 257/728, E25.03

(56) References Cited

U.S. PATENT DOCUMENTS

| | | | | |
|---|---|---|---|---|
| 4,322,778 A | * | 3/1982 | Barbour et al. ............. 174/254 |
| 4,349,862 A | * | 9/1982 | Bajorek et al. ............. 174/258 |
| 4,811,082 A | * | 3/1989 | Jacobs et al. ............... 174/261 |
| 5,186,383 A | * | 2/1993 | Melton et al. ......... 228/180.22 |
| 5,239,448 A | * | 8/1993 | Perkins et al. ............. 361/764 |
| 5,269,453 A | * | 12/1993 | Melton et al. ......... 228/180.22 |
| 5,530,288 A | | 6/1996 | Stone ........................ 257/700 |
| 5,539,241 A | | 7/1996 | Abidi et al. ................ 257/531 |
| 5,564,617 A | | 10/1996 | Degani et al. ............... 228/6.2 |
| 5,569,960 A | * | 10/1996 | Kumazawa et al. ........ 257/738 |
| 5,674,785 A | | 10/1997 | Akram et al. ............... 437/217 |
| 5,688,711 A | | 11/1997 | Person et al. ................ 437/60 |
| 5,770,476 A | * | 6/1998 | Stone .......................... 438/106 |
| 5,874,369 A | * | 2/1999 | Farooq et al. ............. 361/321.3 |
| 5,905,639 A | * | 5/1999 | Warren ....................... 361/776 |
| 5,912,044 A | * | 6/1999 | Farooq et al. ................ 427/79 |
| 5,917,707 A | * | 6/1999 | Khandros et al. ........ 228/179.1 |
| 5,952,893 A | * | 9/1999 | Ghoshal ..................... 331/108 |
| 6,002,161 A | * | 12/1999 | Yamazaki ................... 257/531 |
| 6,057,202 A | * | 5/2000 | Chen et al. .................. 438/381 |
| 6,081,429 A | * | 6/2000 | Barret ........................ 361/767 |
| 6,103,554 A | * | 8/2000 | Son et al. ................... 438/126 |
| 6,108,212 A | * | 8/2000 | Lach et al. ................. 174/255 |
| 6,121,676 A | * | 9/2000 | Solberg ...................... 257/686 |
| 6,137,161 A | * | 10/2000 | Gilliland et al. ............ 257/678 |
| 6,175,158 B1 | * | 1/2001 | Degani et al. .............. 257/777 |
| 6,178,082 B1 | * | 1/2001 | Farooq et al. .............. 361/303 |
| 6,180,433 B1 | * | 1/2001 | Furey et al. ................ 438/106 |
| 6,201,287 B1 | * | 3/2001 | Forbes ....................... 257/528 |
| 6,204,094 B1 | * | 3/2001 | Hotchkiss et al. .......... 438/120 |
| 6,424,034 B1 | * | 7/2002 | Ahn et al. .................. 257/685 |
| 6,529,027 B1 | * | 3/2003 | Akram et al. .............. 324/758 |

OTHER PUBLICATIONS

Burns; "Applications for GaAs and Silicon Integrated Circuits in Next Generation Wireless Communication System"; IEEE Journal of Solid–State Circuits, vol. 30, No. 10, Oct. 1995; p. 1088–1095.

(List continued on next page.)

*Primary Examiner*—George Fourson
*Assistant Examiner*—Fernando L. Toledo
(74) *Attorney, Agent, or Firm*—Dickstein Shapiro Morin & Oshinsky LLP

(57) ABSTRACT

An apparatus is provided for the supply of passive electronic components to a chip containing circuitry capable of operating in a communications system. The invention provides a silicon interposer element chip package which includes a silicon substrate and which is capable of carrying one or more IC chips and which does not suffer semiconductor leeching problems. A silicon substrate is formed from a silicon layer and an insulating layer, preferably an oxide. The invention also provides passive circuits within the interposer element oxide layer. The interposer clement is then bonded to an integrated circuit chip using flip-chip processing.

31 Claims, 7 Drawing Sheets

OTHER PUBLICATIONS

Van Tuyl et al.; "A Manufacturing Process for Analog and Digital Gallium Arsenide Integrated Circuits"; IEEE Transactions on Microwave Theory and Techniques, vol. MTT–30, No. 7, Jul. 1982; p. 935–942.

Nguyen et al.; "Si IC–Compatible Inductors and LC Passive Filters"; IEEE Journal of Solid–State Circuits, vol. 25, No. 4, Aug. 1990; p. 1028–1031.

Chang et al.; "Large Suspended Inductors on Silicon and Their Use in a 2–$\mu$m CMOS RF Amplifier"; IEEE Electron Devices Letters, vol. 14, No. 5, May 1993; p. 246–248.

Burghartz et al.; "Multilevel–Spiral Inductors Using VLSI Interconnect Technology"; IEEE Electron Devices Letters, vol. 17, No. 9, Sep. 1996; p. 428–430.

Burghartz et al.; "Integrated RF and Microwave Components in BICMOS Technology"; IEEE Transactions on Electron Devices, vol. 43, No. 9, Sep. 1996; p. 1559–1570.

Cranickx et al.; "A 1.8–GHz Low–Phase–Noise Spiral–LC CMOS VCO"; IEEE Symposium on VLSI Circuits Digest of Technical Papers, 1996; p. 30–31.

Pieters et al.; "Spiral Inductors Integrated in MCM–D using the Design Space Concept"; IEEE International Conference on Multichip Modules and High Density Packaging, 1998; p. 478–483.

Samber et al.; "Low–Complexity MCM–D Technology with Integrated Passives for High Frequency Applications"; IEEE International Conference on Multichip Modules and High Density Packaging, 1998; p. 285–290.

Hartung; "Integrated Passive Components in MCM–Si Technology and their Applications in RF–Systems"; IEEE International Conference on Multichip Modules and High Density Packaging, 1998; p. 256–261.

Hitko et al.; "A 1V, 5mW, 1.8GHz, Balanced Voltage–Controlled Oscillator with an Integrated Resonator"; Proc. Symp. on Low Power Electronics and Design, Monterey CA, 1997; p. 46–51.

Ahrens et al.; "A 1.4–GHz 3–mW CMOS LC Low Phase Noise VCO Using Tapped Bond Wire Inductances"; Proc. Symp. on Low Power Electronics and Design, Monterey CA, 1998; p. 16–19.

Saia et al.; "Thin Film Passive Elements on Polyimide Film"; IEEE International Conference on Multichip Modules and High Density Packaging, 1998; p. 349–353.

* cited by examiner

METHOD OF MAKING A CHIP PACKAGING DEVICE HAVING AN INTERPOSER

This application is a divisional application of application Ser. No. 09/241,061 filed on Feb. 1, 1999, now U.S. Pat. No. 6,274,937, which is hereby incorporated by reference.

BACKGROUND OF THE INVENTION

1. Field of the Invention

This invention relates to multiple function semiconductor devices and, in particular, to silicon packaging for holding semiconductor devices and passive electronic components in close proximity.

2. Description of the Related Art

Portable wireless communications are a rapidly growing segment of consumer communication devices which are designed to operate in the radio frequency (RF) range. Many of these devices now operate in the L-band, or between 1–2.4 Gigahertz. In light of the increased demand for RF devices and the numerous digital-based communications systems which are currently available, an integrated package capable of delivering RF and digital communications has become desirable. Integrated portable communications devices would allow users to utilize one device for operating in a variety of communications systems. In addition, the integration of components offers attractive savings in terms of packaging size, cost, and energy requirements when compared to the operation of electrically and physically separate systems within one device.

The successful integration of RF devices into known digital communications systems requires the implementation of RF components within digital systems. The group of essential RF components, the front end circuitry of RF devices, generally includes passive electronic components. One of the benefits of using passive components in front end circuitry is that they experience relatively low loss due to the absence of noise from power sources. In addition, passive components may be processed at low cost using relatively few steps and common materials. Passive components include inductors, capacitors, and resistors. These components may be used to provide RF tuned amplifiers, oscillators, and optimizing broad-band filters which are required in RF communication systems.

Integrating RF and digital circuitry on a single package will place restrictions upon the composition and construction of the included components. A key component to the viability of personal communication and similar devices is the conservation of power to preserve battery life. Therefore, integrated digital and RF components, such as inductors, resistors and capacitors, should be able to operate in low power environments. The restriction of having a low power supply has, in the past, limited the advance of integrated systems.

In addition, the production of an integrated package would theoretically be optimized by using known integrated circuit (IC) processes for the manufacture of such systems. The existence of a variety of known IC fabrication processes in addition to the inherent speed, low power consumption, and reduced size of IC make it ideal for use in integrated devices.

Resistors and capacitors form the building blocks of a variety of RF devices. The resistivity of a material is dependant upon its composition and environment. For RF applications, resistors must have precise, low fluctuation resistivity values. For use in RF devices a resistor must be able to operate at relatively low resistivity values due to the reduced voltage available from a power supply as compared to non-integrated IC devices. Similarly, capacitors for RF devices must have predictable values with low tolerances. Construction of capacitors and resistors for use in an integrated system while retaining the necessary RF characteristics is problematic due to the opposing concerns of RF-constrained component operating parameters with the size and power supply parameters of integrated circuits.

The most challenging RF component to adapt to an integrated system is the inductor. Inductors are an essential component of a variety of RF devices, including RF amplifiers which employ a tuned load. RF amplifiers supply gain using inductor-capacitor resonance to nullify device and parasitic capacitance at the center frequency. Such devices also form a secondary filter for noise and out-of-band signals. Inductors in integrated systems must be able to provide relatively large inductance values, ideally greater than 10 nH (dependent upon frequency range) while being physically small such that a compact architecture can be achieved. The inductance value is dependent in large part upon the geometry of the inductor itself. In fact, the inclusion of passive components will often dictate the size of system more than any other part. Thus, design of high valued inductors within compact spaces is necessary for successful RF/digital integration.

Capacitors and inductors in RF front end circuitry must also be tuned to deliver high quality (Q) factors at the operational frequency. A Q factor is dependent upon resistance and either capacitance or inductance, depending upon the component being measured. Maximizing Q while recognizing the necessary limitations set by theoretically effective integrated systems (size, power, etc.) has proven difficult. In addition, inductors and capacitors experience rapid deterioration of performance near their self resonating frequency. A self resonating frequency will vary depending upon the material composition, the size of the device, and the devices surroundings. Many current RF systems operate at frequencies ranging from 1.0 to 2.5 GHz. Therefore, the self resonating frequency of a inductor or capacitor element should be significantly higher than the operating frequency to avoid deterioration of the effectiveness of the element.

Various methods have been used to integrate RF components into IC processes. Gallium-Arsenide (GaAs) substrates are the most common platforms for fabricating RF passive devices in currently known systems. GaAs has several beneficial qualities which make it attractive for use in integrating RF components. Due to the semi-insulating qualities of GaAs, certain passive elements having low to medium Q factors (5–15) may be placed on chip without experiencing severe effect deterioration. However, GaAs-based RF components suffer from limited Q factors due to inherent problems with on-chip noise and physical limitations. In addition, the on-chip noise contributes to increased fluctuations in inductance and capacitance values, rendering them fairly unpredictable. The resulting GaAs-based systems exhibit properties which are unacceptable if the device is to function in future integrated communications networks which will require predictability and high Q factors.

Silicon-based passive components theoretically offer the best combination of qualities for use in integrated systems. Silicon is a relatively inexpensive material for which numerous processing systems have been developed. Silicon bipolar processes have threshold frequencies, from 2–50 GHz, which are sufficient to supply gain through the most common RF communications frequencies. In addition, silicon IC's are capable of higher complexity than GaAs systems, allowing for the possibility of more compact integration.

Though attractive, silicon technology raises several barriers to successful integration of RF and digital technology. Silicon substrates suffer from lower substrate resistivity when compared to GaAs. The inherent conductance of the silicon substrate induces loss and limits inductors and capacitors to poor Q factors. Encasing the transmission line conductors in the oxide insulators used in silicon integrated circuits increases the stray capacitance and lowers the self resonance frequency. Thus, as the frequency received by an integrated communications system is increased, the inductance will decrease. Losses in the conductive silicon substrates are increased by the high dielectric constant of the insulators under the conductors, and relatively large values of stray capacitive coupling to the silicon substrate. Resistors, though effected by their surroundings, generally perform well when deposited on a silicon substrate. Poor Q value in capacitors and inductors and RF/digital line conductor loss have created significant barriers to fabrication of a viable integrated system. Though several attempts to solve these problems have been made, no device has addressed each of these concerns sufficiently. The effect of a silicon substrate on passive device performance is described in Intergrated Passive Components in MCM-Si Technology and their Applicatin in RF-Systems, IEEE 1998 International Conference on Multichip Module and High Density Packaging, 1998 (Hartung). A multilayer construction containing a one micron thick silicon dioxide layer as an insulator was formed on a silicon substrate and significant performance loss was found in passive devices formed within the multilayer construction due to the low resistivity of the silicon substrate.

Several prior art schemes have been developed to deal with problems inherent in silicon-based passive element fabrication and integration. One solution utilizes an air bridge between an inductor and the silicon substrate as described in U.S. Pat. No. 5,539,241 (Abidi et al.). FIG. 8 shows a typical air bridge construction wherein a cavity 254 is etched in substrate 250. Inductor elements 256 are then deposited in oxide layer 252 such that the inductor elements 256 are located above the cavity 254. The cavity 254, filled with air, acts as an insulator between the inductors 256 and the semiconductor substrate 250 and, therefore, reduces the negative effects which come from having a silicon substrate.

Similarly, the use of suspended wire spans is described in A 1V, 5 mW, 1.8 GHz Balanced Voltage-Controlled Oscillator with an Intergrated Resonator (Hitko, et al.), to create inductors for use in silicon-based voltage controlled oscillators (VCO). Shown in FIGS. 9a and 9b, the design is comprised of metal. wires 304 suspended from the surface of the substrate 300 by the use of pads 302. The wires 304 are formed in a U shape, shown in FIG. 9b, and are suspended above substrate 300 such that air acts as an insulator between the silicon substrate 300 and the wires 304. The metal wires 304 are electrically connected to circuit elements contained within the substrate 300 through contacts 306.

Higher Q inductors have also been developed in silicon-based substrates using a five to six level metal BiCMOS technology, as described in Intergrated RF and Microwave Components in BiCMOS Technology, 43 IEEE Transactions on Electron Devices 9, 1996 (Burghartz). However, the implementation of spiral inductors using this technology is not practical in light of the fact that the five to six levels of metal architecture needed is far in excess of the two to four levels most commonly used in CMOS construction processes.

Integration of spiral inductors has also been accomplished for discrete multi-chip modules (MCM-D) using LSI technology. As described in Low-Complexity MCM-D Technology with Intergrated Passives for High Frequency Applicatons, IEEE 1998 (Samber et al.), the process uses a double metal back-end process on isolated high-ohmic silicon and incorporates a resistor layer, thin film resistors, capacitors, and inductors.

Integration of passive components into MCM-Si technology has proven to be difficult. Silicon is preferred because it is relatively easy to process, there are known methods for processing, and it achieves good flatness and reduced roughness over comparable materials. Passive devices in silicon would also have similar thermal coefficients to the chip die, ensuring environmental compatibility. U.S. Pat. No. 5,770,476 teaches the use of an interposer constructed of a conductor-insulator-conductor on which passive devices are created. None of the described methods produces silicon-based system within which high-Q inductors and capacitors can be placed in close proximity to a chip containing digital circuitry.

SUMMARY OF THE INVENTION

The present invention provides a multi-chip module that is able to overcome some of the problems attendant the integration of RF and digital circuitry within the same packaging.

The above and other features and advantages of the invention are achieved by providing an apparatus for the supply of passive electronic elements to a chip containing circuitry capable of operating in a digital-based communications system. The invention provides a silicon interposer chip package which includes a silicon substrate and which is capable of carrying one or more IC chips and which does not suffer semiconductor leeching problems. A silicon substrate is formed from a silicon layer and an insulating layer, the latter of which is preferably constructed of oxide. Passive circuit elements are fabricated within and/or on the interposer insulating layer. Integrating the passive circuit elements within and/or on the interposer insulating layer and the connection of the interposer with an integrated circuit chip increases the overall efficiency of the device. The interposer is bonded to the integrated circuit chip using flip-chip processing. The resulting silicon based CMOS package has passive circuit elements having superior Q factors and exhibits an overall increase in mechanical strength in comparison to most known methods for integrating RF integrated circuit components.

The above and other advantages and features of the present invention will be better understood from the following detailed description of the preferred embodiment which is provided in connection with the accompanying drawings.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. Wherever possible, like numerals are used to refer to like elements and functions in the various figures of the drawings and between the different embodiments of the present invention.

Figure 1:
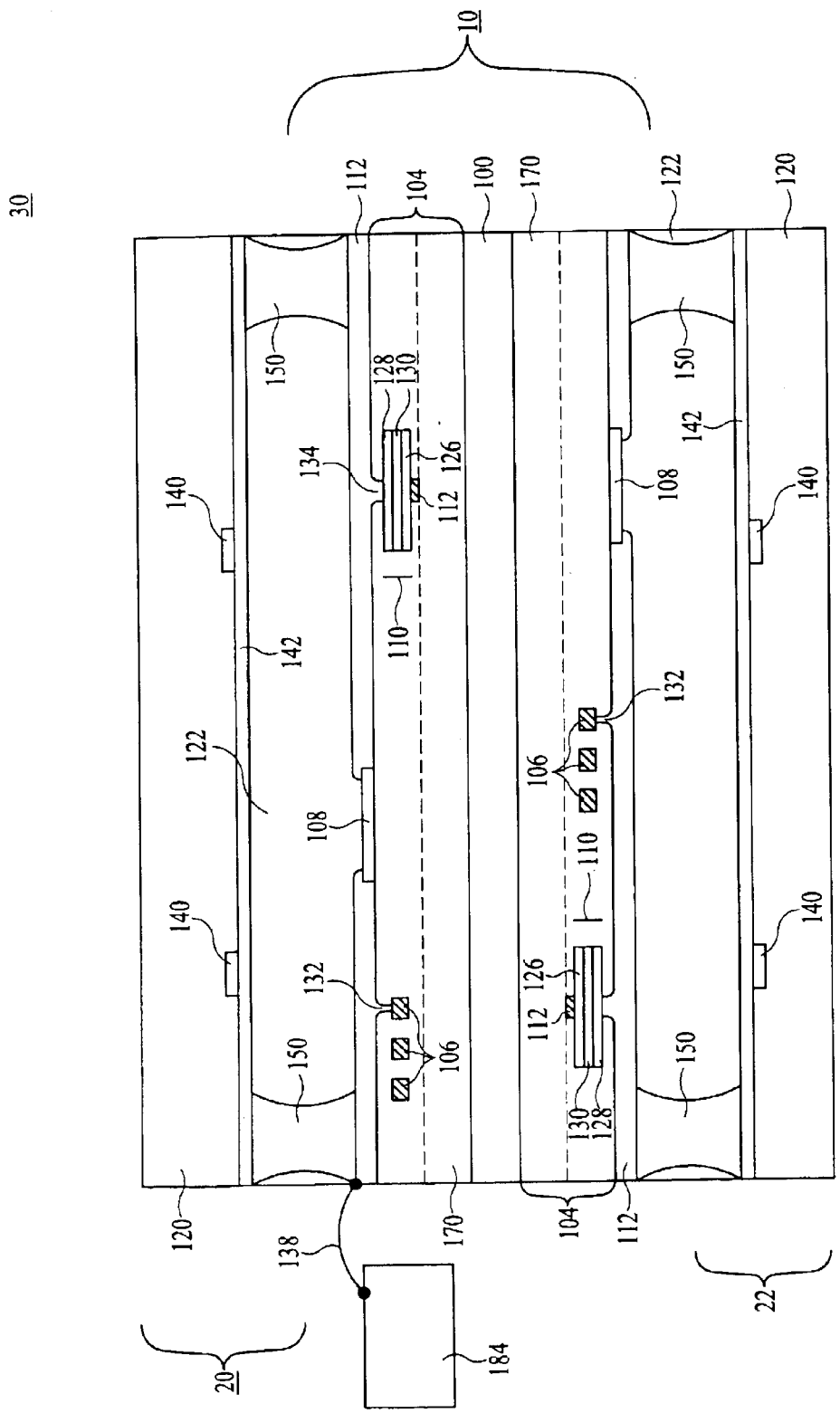
FIG. 1 is a cross sectional view of a preferred embodiment of the present invention.

An integrated circuit chip package 30 in accordance with the present invention is illustrated generally in FIG. 1. Package 30 consists of an interposer 10 and integrated circuit ("IC") chips 20, 22. To allow for the integration of active and passive circuit elements in a package 30 having a compact architecture, the interposer 10 has a substrate layer 100 and an insulating layer 104 which may be formed on one or both sides of substrate layer 100. Passive circuit elements, represented in the embodiment of FIG. 1 as inductors 106, resistors 108, and capacitors 110 are formed in and/or on the insulating layers 104. The passive circuit elements are separated from the substrate layer 100 by a barrier layer 170 of the insulating layer 104. Though shown in FIG. 1 as inductors 106, resistors 108, and capacitors 110, the passive circuit elements contained within interposer 10 may be any device which does not require an external power source for operation. Passive elements on the same side of the interposer 10 are interconnected by conductor lines 112, which are preferably metal lines. The integrated circuit chips 20, 22 are comprised of chips 120 which contain at least one integrated circuit element 140 and conductor lines 142, which are also preferably metal lines, to form an electrical connection between the integrated circuit elements 140 and from the integrated circuit elements 140 to solder joints 150. The IC chips 20 are preferably flip-chip mounted onto interposer 10 though solder joints 150 which connect conductor lines 112 of the interposer 10 to conductor lines 142 of the chips 120. A wire bond 138 or a lead frame may be connected to either the IC chips 20, 22 or the interposer 10 to facilitate connection of the package 30 to an outside source, such as a circuit board 184 or another package 30. As shown in FIG. 1, the open spaces between the IC chips 20, 22 and the interposer 10 is filled with an epoxy 122. The epoxy 122 provides for passivation and improves the fatigue characteristics of the solder joints 150 which exist between the IC chips 20, 22 and the interposer 10.

Silicon is a particularly suitable material for forming the substrate 100 of interposer 10. Silicon is inexpensive and readily available. Further, the material characteristics of silicon, specifically the thermal characteristics, match those of IC chips 20, 22 which are commonly formed of silicon. In addition to silicon, gallium arsenide (GaAs) may also be used for the substrate 100 of the interposer 10.

The insulating layer 104 exists on one or both sides of the substrate 100 and forms an effective barrier layer 170 between the passive elements, e.g. the inductors 106, the capacitors 110 and the resistors 108, and the substrate 100. The formation of the barrier layer 170 prevents effect degradation of the inductors 106, the capacitors 110 and the resistors 108 by eliminating loss caused by the inherent conductance of the semiconductor substrate 100. In the embodiment in which substrate layer 100 is formed of silicon, the insulating layer 104 may be a silicon-oxide ($SiO_2$) layer which is formed on one or both sides of a silicon substrate 100 such that the inductors 106, the capacitors 110 and the resistors 108 are shielded from the silicon substrate 100 by a barrier layer 170 of the insulating layer 104 sufficient to eliminate conductance to the substrate 100.

IC chips 20, 22 may be any CMOS-based chips containing logic device elements such as transistors. For example, the IC chips 20, 22 may be a storage device such as a memory chip, a microprocessor chip. Alternatively, the IC chips 20, 22 may contain analog circuits or a combination of analog and digital circuits. In one preferred embodiment IC chips 20, 22 are provided which contain digital-based communication circuitry. Each of the IC chips 20, 22 contains a plurality of integrated circuit elements 140 and interconnecting conductor lines 142 which also connect with solder joints 150. Chip 120 may be constructed using a silicon substrate, a GaAs substrate, or any other material substrate known for use in integrated circuit fabrication. The digital circuit elements 140 may be transistor elements such as MOSFET transistors. In one embodiment of the present invention, the digital circuit elements 140 of the chips 120 form the required analog and digital circuitry for an analog/digital RF communication system.

Figure 2A:
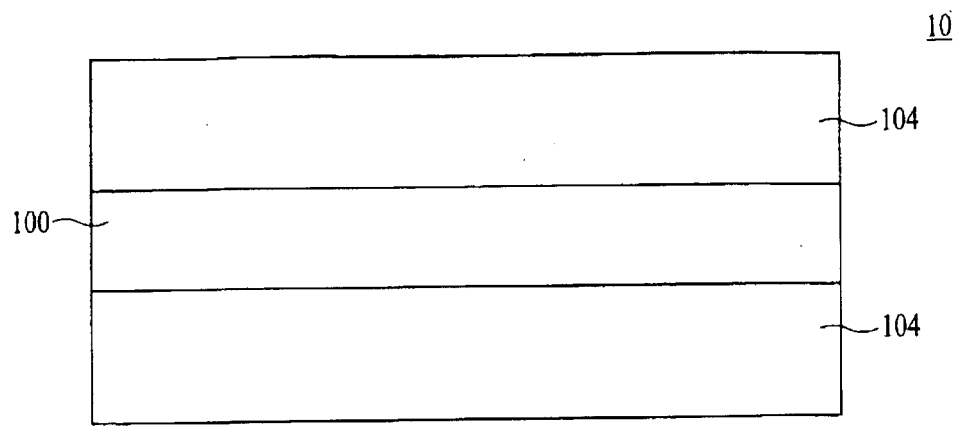
FIGS. 2a–c are cross sectional views depicting the fabrication of an interposer shown in FIG. 1.

The process for forming package 30 will next be described with reference to FIGS. 2a–5. FIG. 2a shows the interposer 10 in a preliminary stage of construction having a substrate 100 and insulating layers 104 on opposite sides of the substrate 100. The substrate 100, which may ultimately yield many interposers 10, is subjected to an oxide deposition, preferably silicon dioxide ($SiO_2$) on a silicon substrate 100. Oxide deposition may occur through methods known in the art, for example thermal oxidation, chemical vapor deposition, and sputtering techniques. The oxide deposition process forms an insulating layer 104 on both major surfaces of the silicon substrate 100. The insulating layer 104 is thin in comparison to the substrate 100, for example, the insulating layer 104 may be between 3–5 microns thick for a substrate 100 having a thickness of 50 microns.

Alternatively, insulating layer 104 may be formed on only one or apart of one or both surfaces of the substrate layer 100, as desired. For purposes of farther description of the invention an interposer 10 having insulating layers 104 on both sides of substrate 100 will be discussed.

Figure 2B:
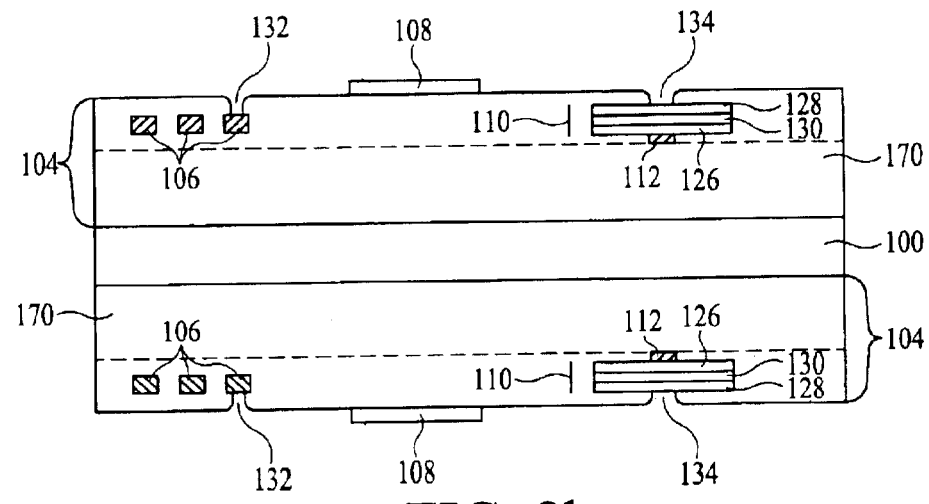
Figure 2C:
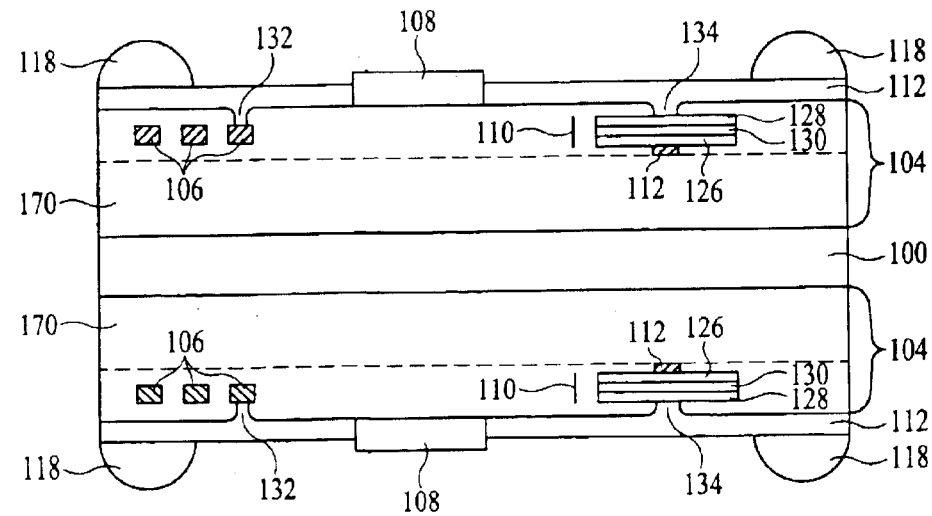

Referring now to FIGS. 2b and 2c, once the insulating layers 104 have been formed, inductors 106, resistors 108, and capacitors 110 and metal interconnect lines 112 are formed in and on an upper surface of the insulating layers 104 through a variety of techniques, described below. A barrier layer 170 of insulating layer 104 remains between the inductors 106, resistors 108, capacitors 110, and conductor lines 112 and the substrate 100 sufficient to shield the inductors 106, resistors 108, capacitors 110, and conductor lines 112 from the conductance of the substrate 100. The formation of the inductors 106, A resistors 108, capacitors 110, and conductor lines 112 may be accomplished in any order and will be dictated by the desired number and placement of passive elements within the interposer 10.

The resistors 108 are preferably thin-film, precision valued resistors. Utilizing thin film construction for the resistors 108 simplifies the construction of the package 30 while allowing a compact architecture to be maintained. The resistors 108 may be formed on the surface of insulating layer 104 by film deposit, masking sequences, or by lift-off techniques. The resistors 108 may be formed of any metallic material having the desired resistance characteristics such as, for example, nichrome, titanium, or tungsten. The reduction in size and weight possible with thin film techniques is complemented by the fact that wire bonds are not needed since there is direct metallization contact through conductor lines 112 to the resistors 108, as shown in FIG. 2c. This results in compact architectures and improved performance due to a reduction in the parasitic effects attributed to wire bonds.

Figure 8:
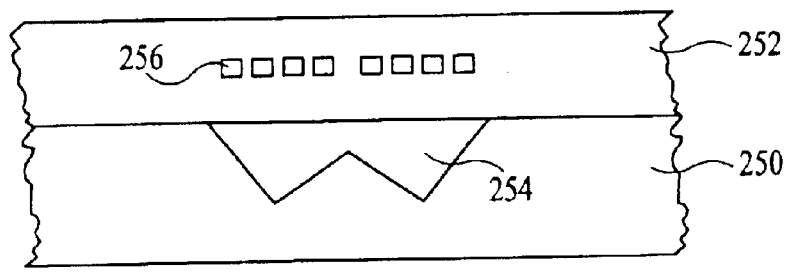
FIG. 8 is a cross sectional view of a prior art inductor element utilizing an air bridge.
Figure 9A:
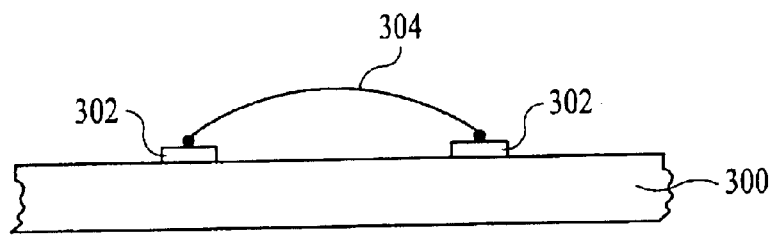
FIGS. 9a–b are side and top views of a prior art inductor element utilizing wire spans.
Figure 9B:
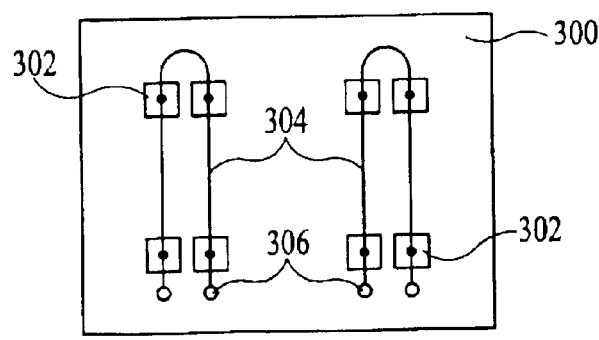

The capacitors 110 are also constructed using thin film processes such as, for example, film deposit, masking sequences or lift-off techniques. The capacitors 110 are preferably metal-dielectric-metal capacitors each formed by depositing a pair of metal layers, the storage node 126 and the cell plate 128, separated by a deposited dielectric layer 130. The storage node 126 and the cell plate 128 are preferably formed of a metallic material and may vary in size dependant upon the desired storage capacity of the individual capacitors 110. Storage node 126 is required as the substrate 100 cannot act as part of the capacitor 110 due to the thickness of barrier layer 170. The storage node 126 is electrically connected to other passive elements and solder joints 150 through conducting lines 112, preferably metal lines, deposited prior to deposition of the storage node 126. The dielectric layer 130 is preferably another layer of oxide similar to that which forms insulating layer 104 and is grown after deposition of the storage node 126. The dielectric layer 130 may be, for example, a thin silicon dioxide layer having a thickness of less than 1500 Å. Alternatively, the dielectric layer 130 may be comprised of an oxide-nitride-oxide dielectric which would allow the capacitors 110 to occupy a smaller overall area. The insulating layer 104 is then grown through oxide deposition to encase the capacitors 110. To allow electrical contact to the capacitors 110, wells 134 are etched into insulating layer 104 such that the cell plates 128 are exposed. The wells contain conductors connected to conducting lines 112. Because the capacitors 110 are completely encased in the insulating layer 104, the present invention is mechanically stronger than other passive element constructions, such as those using the air-bridge construction shown in FIG. 8.

The inductors 106 are preferably metal spiral inductors formed by deposition of a thin metallic layer in a spiral shape after formation of the barrier layer 170 of the insulating layer 104, as shown in FIG. 2b. This is followed by additional oxide growth of insulating layer 104 such that the inductors 106 are encased by insulating layer 104. Spiral inductors are thin strips of metal formed in a spiral shape parallel to the plane of the surface of insulating layer 104. The benefit of using spiral inductors for the passive element inductors 106 is that a significant reduction in overall size is possible, in comparison to non-spiral inductors, which reduces resistance in the inductors 106 and, therefore, results in higher Q factors for the inductors 106. The inductors 106 may be formed by any number of known techniques such as sputtering, evaporation, chemical vapor deposition, physical vapor deposition, etc. As noted, after deposition of the inductors 106, the insulating layer 104 is grown to encase the spiral inductor 106 as shown in FIGS. 2b and 2c. To allow electrical contact to the inductors 106, wells 132 are etched into the insulating layers 104 such that a portion of the inductors 106 is exposed for electrical connection to conducting lines 112.

Figure 3:
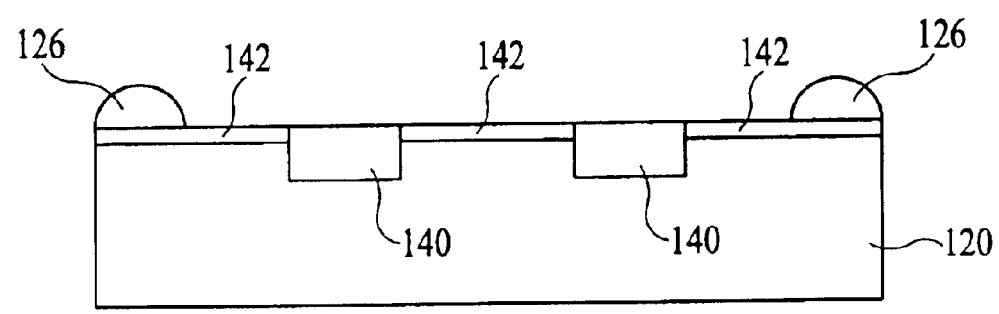
FIG. 3 is a cross-sectional view of an integrated circuit chip shown in FIG. 1.

Referring to FIG. 2c, the inductors 106, resistors 108, and capacitors 110 of the interposer 10 are electrically connected by conductor lines 112, preferably metal lines, which may be formed at varying points in the processing of interposer 10, as needed. Conductor lines 112 form a 'bus' for connecting the inductors 106, resistors 108, capacitors 110, and any other elements situated on or within the insulating layers 104 of the interposer 10. To form an electrical contact to the inductors 106 and capacitors 110 the conductor lines 112 must fill wells 132, 134, respectively. Conductor lines 112 may be constructed of, for example, aluminum (Al), copper (Cu), or silver (Ag) deposited by masked sputtering, evaporation, chemical vapor deposition, or physical vapor deposition techniques. Although the conductor lines 112 are shown in FIGS. 1, 2c, and 3 to consist of one layer of metal, any number of conductor lines 112 may be deposited on any number of insulating layers as are needed for circuit connection depending upon the placement of passive or active devices within the interposer 10.

In another embodiment of the invention, a polyamnide film is used to construct insulating layer 104 instead of an oxide material. The inductors 106, resistors 108, capacitors 110, and conductor lines 112 are deposited in the polyamide film layer 104 through flex circuit manufacturing processes. Polyamide may be preferred to oxide in cases where lower capacitance is required. In addition, polyamide offers insulating capabilities similar to oxides but with a lower required thickness which reduces the overall size of package 30. Therefore, the use of polyamide film layers 104 may further shrink the geometry of integrated communications systems utilizing the present invention.

When the present invention is used in digital/analog RF communications systems, the inductors 106, resistors 108 and capacitors 110 are formed such that the passive RF circuitry is formed in the interposer 10. The passive elements may also be formed on the surface of the insulating layer 104. The capacitor 110, resistor 108 and inductor 106 may also be used as components in the implementation of RF circuits including, for example, oscillators, tuned amplifiers, and broad band amplifiers.

Figure 4:
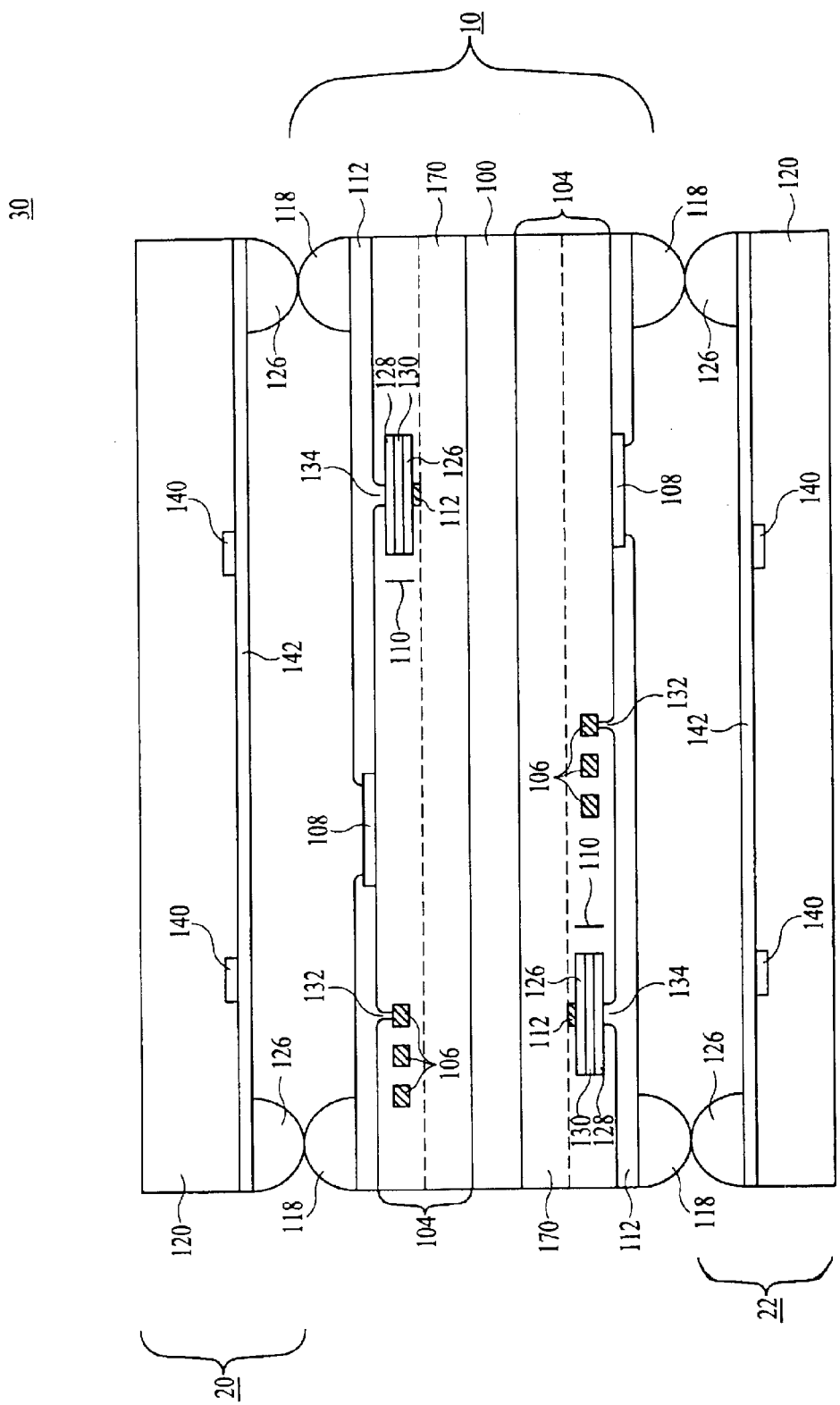
FIG. 4 is a cross sectional view of the FIG. 1 arrangement just prior to bonding of various elements together.

Although FIGS. 1–2, and 4 generally show one inductor 106, resistor 108, and capacitor 110 on or within the insulating layers 104 on each surface of the substrate 100, any number or combination of passive circuit elements may be used on one or both sides of the substrate 100. Alternatively, the interposer substrate 100 may also have active devices built on or into the insulating layers 104 on one or both sides of the substrate 100. At a minimum, interposer 10 has at least one passive element on one surface thereof and a barrier layer 170 between the passive elements and substrate 100.

To facilitate connection of the interposer 10 to the IC chips 20, 22, solder ball leads 118 are formed on interposer 10 as shown in FIG. 2c. The connection of the solder ball leads 118 to the interposer 10 is accomplished by placing solder balls on pads connected to conductor lines 112 of the interposer 10 such that an electrical connection is made between the conductor lines 112 and the solder ball leads 118 at selected points. Similarly, solder balls 126 are formed on the surface of a chip 120 such that electrical connection to integrated circuit elements 140 is established through conducting layer 142 as shown in FIGS. 3 and 4. The solder ball leads 118, 126 are, preferably, composed of Cr—Cu—Au, Zr—Ni—Cu—Au, Ti—Ni—Cu—Au, or lead-based (Pb) composites. If a global heating method is to be used, wherein the temperature of the entire package 30 is raised to a temperature sufficient to melt the solder ball leads 118, 126, the use of different types of solder having different melting points may be desirable to form individual or groups of solder ball leads 118 and 126. For example, Pb 2.5% solder may be used for the solder ball leads 118, 126 on one surface of the interposer 10, and Pb 11% solder may be used for the solder ball leads 118, 126 for the other surface of interposer 10. Further, another different type of solder, for example Pb-62% Sn, may be used for soldering the interposer 10 into a circuit board. Alternatively, the solder ball leads 118, 126 are heated locally so that the heating of one solder joint 150 does not cause heating of other solder joints 150, such as those on the opposing surface of the interposer 10.

After the interposer 10 has been constructed and the IC chips 20, 22 have been provided, the interposer 10 is ready to have the IC chips 20, 22 mounted on its opposing surfaces. The packaging system 30 of the present invention is formed by mounting the IC chips 20, 22 to the interposer 10 by a process often called "flip chip" bonding, as shown in FIGS. 1 and 4. The interposer 10 and IC chips 20, 22 are arranged (or "flipped") with solder ball leads 118 touching corresponding solder ball leads 126 on interposer 10 and IC chips 20, 22, respectively, as shown in FIG. 4. The solder ball leads 118 and 126 are then heated to or above the melting point temperature of the specific solder material used such that solder joints 150 are formed, as shown in FIG. 1.

Using a "flip chip" manufacturing method allows for the production of high-density device assemblies. The assembly method places the passive device elements, inductors 106, resistors 108, and capacitors 110, in close physical proximity to the circuitry contained within IC chips 20, 22 to reduce the overall size of package 30. Therefore, the compact architecture needed to successfully integrate RF and digital circuitry can be realized. Although FIG. 4 shows interposer 10 and each IC chip 20, 22 having two solder ball leads 118, 126, respectively, any number of solder ball leads may be formed on the interposer 10 and IC chips 20, 22 depending upon the number of electrical connections required between the interposer 10 and the specific IC chips 20, 22 used in the package 30.

As an alternative to the use of solder balls 118, 126, a conductive adhesive may be used to attach the IC chips 20, 22 to the interposer 10, thereby avoiding any problems associated with heating.

Figure 5:
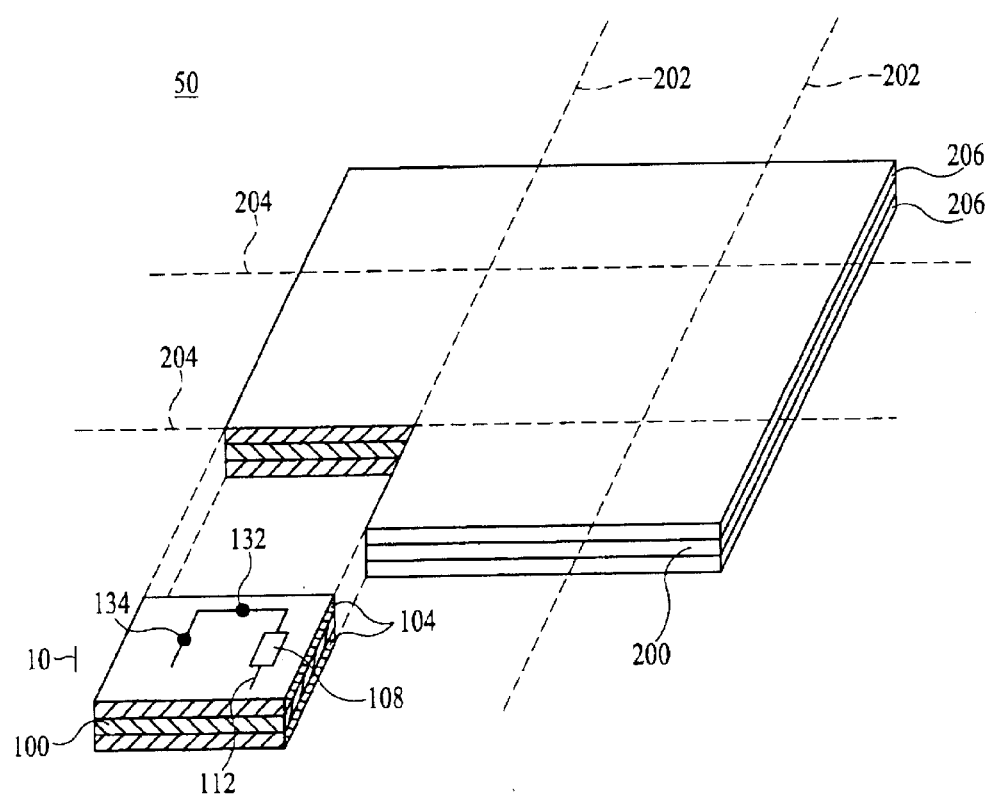
FIG. 5 is a perspective view of a substrate containing a plurality of interposers which are to be diced therefrom.

In yet another embodiment of the invention, a single semiconductor substrate may be used to form interposers 10. FIG. 5 shows a product 50 having a silicon substrate layer 200 and insulating layers 206 which have been processed to form a number of interposers 10 according to the present invention. The product 50 may then be diced along lines 202, 204 to form individual interposers 10 for use in the construction of packages 30 according to the present invention to save time and production costs. Actual dicing of the product 50 may occur at any stage of the processing of the interposer 10 such as, for example, after an interposer is populated with passive circuits and wired as described above, or following formation of the insulating layer 104 and prior to the formation of the passive circuits.

Figure 6:
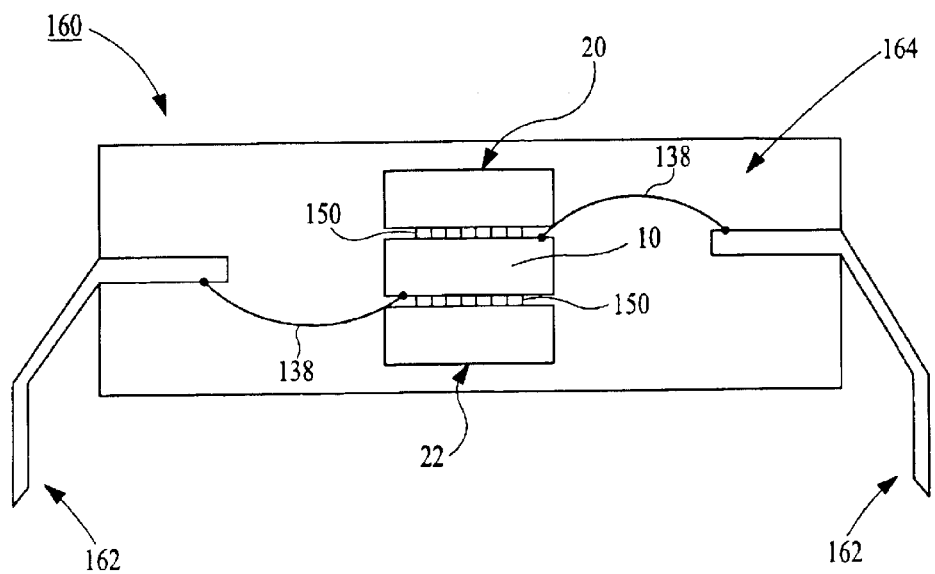
FIG. 6 is a cross sectional view of FIG. 1 structure encapsulated with a lead frame.

Once the package 30 has been fabricated it can be mounted on a larger circuit board and/or connected to other elements. The mounting of the package 30 may be accomplished by mechanical means well-known in the art, such as through the use of lead frames. FIG. 6 shows a lead frame 160 for carrying the completed package 30 having wire bonds or leads 162. The leads 162 of the lead frame 160 will connect to either the IC chips 20, 22 or the interposer 10 through wire bonds 138 or the chips and/or interposer can be, in part or in whole, directly bonded to the lead frame. In order to protect the interposer 10 and the IC chips 20, 22, the unit may be encapsulated by methods well-known in the art, such as through an epoxy encapsulation 164 or sealing in a container which is vacuum-sealed or filled with an inert gas.

Figure 7:
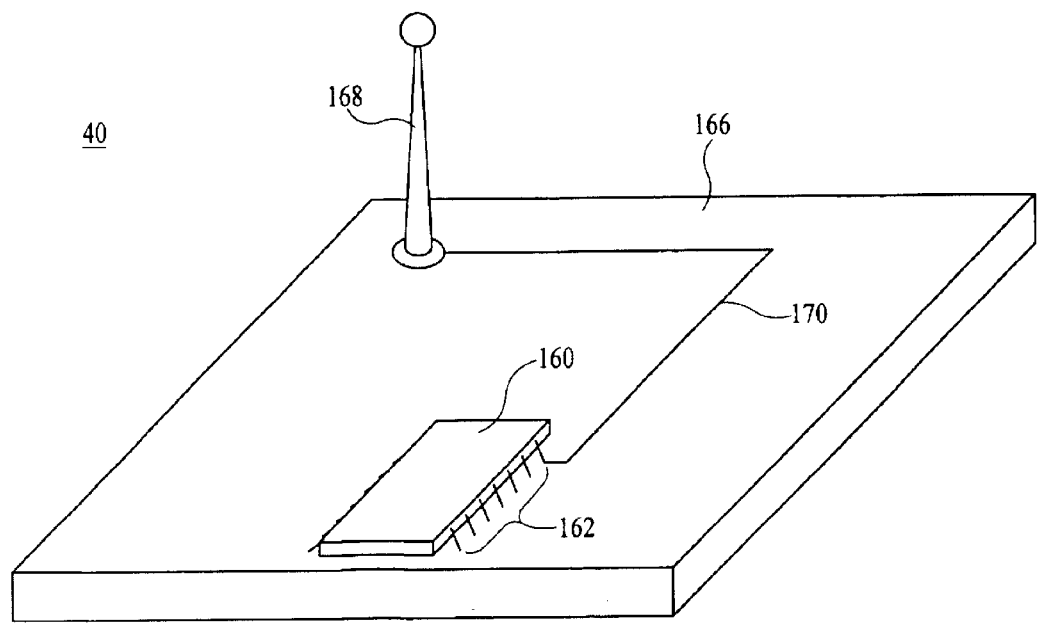
FIG. 7 is a perspective view of an RF/digital communications system utilizing the FIG. 6 structure.

FIG. 7 shows the implementation of the lead framer 160 containing the package 30 of the present invention within an integrated RF/digital communications system 40. Lead frame 160 is electrically connected to a circuit board 166 through leads 162. At least one lead 162 is connected through conductor line 170 to an antenna 168 for receiving and sending RF signals which are processed by the package 30 contained within the lead frame 162.

With the present invention, the integration of RF analog circuit elements and digital circuit elements within a single circuit package which is compact and does not suffer from semiconductor substrate induced effect degradation is performed without the need to use mechanically weak constructs such as substrate air-bridges and without the need to use a non-semiconductor base for the implementation of passive circuit elements.

It should be readily understood that the invention is not limited to the specific embodiment described and illustrated above. Rather, the invention can be modified to incorporate any number of variations, alterations, substitutions or equivalent arrangements not heretofore described, which are commensurate with the spirit and scope of the invention. Accordingly, the invention is not limited by the foregoing description, but is only limited by the scope of the appended claims.

What is claimed as new and desired to be protected by Letters Patent of the United States is:

1. A process for forming an interposer element for use as a chip carrier comprising the steps of:

providing an insulating layer on at least one surface of a silicon substrate; and processing said insulating layer to produce at least one passive circuit element on or within said insulating layer, said at least one passive circuit element being separated from said silicon substrate by a portion of said insulating layer, said portion of said insulating layer having a thickness such that said at least one passive circuit element is electrically shielded from said silicon substrate, solder bonding at least one integrated circuit chip to said interposer element, by forming a plurality of individual solder ball leads, wherein two or more of said individual solder ball leads use differing types of solder having differing melting points, such that said at least one integrated circuit chip is electrically connected to said at least one passive circuit element; and forming a metallization pattern on or within said insulating layer, said metallization pattern being connected with said at least one passive circuit element.

2. The process according to claim 1, wherein said insulating layer is formed of an oxide.

3. The process according to claim 2, wherein said oxide is silicon dioxide (SiO2).

4. The process according to claim 3, wherein said insulating layer has a thickness within a range of three to five microns.

5. The process according to claim 1, wherein said insulating layer is formed of polyamide.

6. The process according to claim 1, wherein said step of processing said insulating layer further comprises the step of producing a plurality of passive circuit elements on or within said insulating layer.

7. The process according to claim 6, wherein said plurality of passive circuit elements includes a resistor element.

8. The process according to claim 7, wherein said resistor element is a thin film metal resistor.

9. The process according to claim 6, wherein said plurality of passive circuit elements includes a capacitor element.

10. The process according to claim 9, wherein said capacitor element is a thin film capacitor.

11. The process according to claim 10, wherein said thin film capacitor includes a dielectric layer.

12. The process according to claim 11, wherein said dielectric layer is an oxide composition.

13. The process according to claim 11, wherein said dielectric layer is an oxide-nitride-oxide composition.

14. The process according to claim 6, wherein said plurality of passive circuit elements includes an inductor element.

15. The process according to claim 14, wherein said inductor element is a spiral inductor.

16. The process according to claim 6, further comprising the step of forming at least one passive circuit device for use in radio frequency (RF) communications systems, said passive circuit device having at least one of said plurality of passive circuit elements and electrically connected to said at least one integrated circuit chip.

17. The process according to claim 16, further comprising the step of arranging the interposer element and said at least one integrated circuit to form circuitry for use in RF communications systems.

18. The process according to claim 17, wherein said at least one passive circuit device is for use in a load amplifier.

19. The process according to claim 17, wherein said at least one passive circuit device is for use in a broad band amplifier.

20. The process according to claim 17, wherein said at least one passive circuit device is for use in an oscillator.

21. The process according to claim 20, wherein said oscillator is a voltage controlled oscillator.

22. The process according to claim 17, wherein said at least one integrated circuit chip contains analog circuitry.

23. The process according to claim 17, wherein said at least one integrated circuit chip contains digital circuitry.

24. The process according to claim 23, wherein said integrated circuit chip is a microprocessor.

25. The process according to claim 23, wherein said integrated circuit chip is a memory chip.

26. The process according to claim 17, further comprising the step of forming a bonding layer, said bonding layer located in the area between said at least one integrated circuit chip and said insulating layer.

27. The process according to claim 26, wherein said bonding agent is epoxy.

28. The process according to claim 27, further comprising the step of encapsulating the interposer element and said at least one integrated circuit to form a circuit package, said circuit package having conducting leads on an outer side of said package.

29. The process according to claim 28, further comprising the step of providing conductive leads connecting the interposer element and said at least one integrated circuit to said conductive package leads of said circuit package.

30. The process according to claim 29, further comprising the step of providing an insulating layer to both surfaces of said silicon substrate.

31. The process according to claim 1, said step of processing said insulating layer further comprising the step of providing at least one passive circuit element in each of a plurality of areas of said insulating layer, dividing said silicon substrate into said areas, and bonding at least one integrated circuit chip to each of said areas of said insulating layer to form respective chip carriers.

* * * * *